(12) United States Patent
Ozawa

(10) Patent No.: US 7,705,391 B2
(45) Date of Patent: Apr. 27, 2010

(54) SEMICONDUCTOR DEVICE AND METHOD OF MANUFACTURING THE SAME

(75) Inventor: Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 122 days.

(21) Appl. No.: 11/226,287

(22) Filed: Sep. 15, 2005

(65) Prior Publication Data

US 2006/0060913 A1      Mar. 23, 2006

(30) Foreign Application Priority Data

Sep. 22, 2004    (JP) .............................. 2004-275528

(51) Int. Cl.
*H01L 21/336* (2006.01)

(52) U.S. Cl. .................. 257/315; 257/314; 257/316; 257/239; 257/261; 257/E21.209; 438/201; 438/255; 438/257

(58) Field of Classification Search ................. 257/239, 257/261, 314–326; 438/201, 255, 257
See application file for complete search history.

(56) References Cited

U.S. PATENT DOCUMENTS

| | | | |
|---|---|---|---|
| 6,567,312 B1 * | 5/2003 | Torii et al. ............. | 365/185.28 |
| 7,183,153 B2 * | 2/2007 | Lutze et al. ............. | 438/201 |
| 2001/0015454 A1 * | 8/2001 | Lee et al. ............. | 257/315 |

FOREIGN PATENT DOCUMENTS

| | | |
|---|---|---|
| JP | 08-088285 | 4/1996 |
| JP | 9-186257 | 7/1997 |
| JP | 11-177066 | 7/1999 |
| JP | 2003-289114 | 10/2003 |
| JP | 2004-22819 | 1/2004 |
| JP | 2005-277035 | 10/2005 |
| KR | 2001-0055883 | 7/2001 |

OTHER PUBLICATIONS

Notification for Filing Opinion issued by the Korean Patent Office on Nov. 22, 2006, for Korean Patent Application No. 10-2005-87366, and English-language translation thereof.
Notification of Reasons for Rejection Mailed by the Japanese Patent Office on Aug. 19, 2008 in Counterpart Application No. 2004-275528 (11 pages).
Notification of Reasons for Rejection Mailed by the Japanese Patent Office on Jan. 6, 2009 in Counterpart Application No. 2004-275528 (8 pages) with English Translation thereof (8 pages).

* cited by examiner

*Primary Examiner*—Zandra Smith
*Assistant Examiner*—Telly D Green
(74) *Attorney, Agent, or Firm*—Finnegan, Henderson, Farabow, Garrett & Dunner, L.L.P.

(57) ABSTRACT

According to an aspect of the invention, there is provided a semiconductor device including a plurality of memory cells, comprising a plurality of floating gate electrodes which are formed on a tunnel insulating film formed on a semiconductor substrate and have an upper portion which is narrower in a channel width direction than a lower portion, an interelectrode insulating film formed on the floating gate electrodes, and a control gate electrode which is formed on the interelectrode insulating film formed on the floating gate electrodes and partially buried between the floating gate electrodes opposing each other.

14 Claims, 5 Drawing Sheets

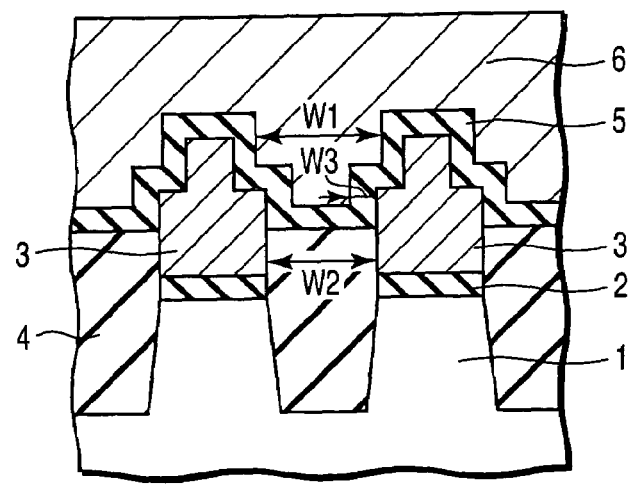
F I G. 2
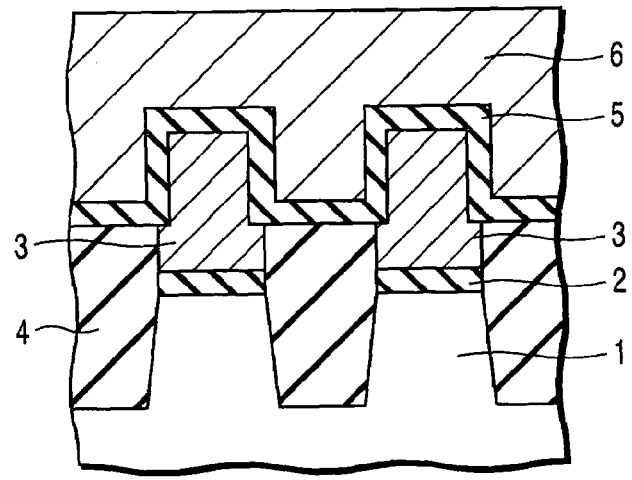
F I G. 3
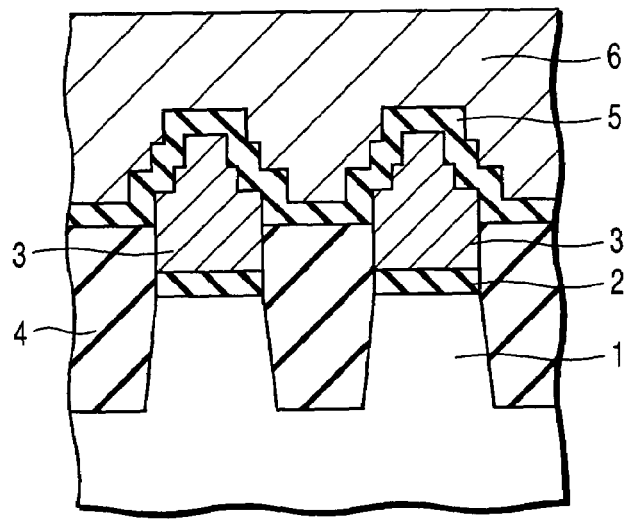
F I G. 4

US 7,705,391 B2

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2004-275528, filed Sep. 22, 2004, the entire contents of which are incorporated herein by reference.

BACKGROUND OF THE INVENTION

1. Field of the Invention

The present invention relates to a semiconductor device having a floating gate electrode and a method of manufacturing the same.

2. Description of the Related Art

FIG. 9A is a view showing the structure of conventional nonvolatile memory cells. FIG. 9A is a sectional view in the direction of word lines (channel width direction: a direction perpendicular to a direction in which a channel current flows). A tunnel insulating film 2 is formed on a silicon substrate 1. A plurality of floating gate electrodes 3 are arranged on the tunnel insulating films 2 while being separated from each other by a predetermined distance. An element isolation insulating film 4 is buried between the lower portions of the floating gate electrodes 3. An interelectrode insulating film 5 is formed on part of the side surfaces and the upper surface of each floating gate electrode 3, and the upper surface of the element isolation insulating film 4. A control gate electrode 6 is formed on the interelectrode insulating film 5.

FIG. 9B is a view showing the structure of the nonvolatile memory cells. FIG. 9B is a sectional view in the direction of bit lines (channel length direction: a direction in which a channel current flows). A plurality of cell diffusion layers 7 are formed in the surface of the silicon substrate 1. A plurality of stacking cells CE each including the floating gate electrode 3, interelectrode insulating film 5, and control gate electrode 6 are arranged on the tunnel insulating film 2 between the cell diffusion layer 7 while being separated from each other by a predetermined distance. An interlayer dielectric film 8 is buried between the stacking cells CE.

As shown in FIG. 9B, the floating gate electrodes 3 adjacent in the bit line direction (channel length direction) oppose each other via the interlayer dielectric film 8. Along with advanced micropatterning of memory cells, the opposing distance shortens. Hence, a parasitic capacitance C between the opposing surfaces of the adjacent floating gate electrodes 3 increases. For this reason, the write/erase state of an adjacent cell affects the operation characteristic of a cell of interest, and so-called intercell interference occurs, resulting in an operation error in the memory.

As shown in FIG. 9A, the width of the control gate electrode buried between the floating gate electrodes 3 adjacent in the word line direction (channel width direction) becomes small as micropatterning of memory cells progresses. Consequently, as the buried portion of the control gate electrode is normally made of a semiconductor containing a dopant impurity, the dopant impurity concentration becomes low in the buried portion. Hence, depletion occurs in the buried portion when a high electric field is applied in a write/erase operation. For this reason, the decrease in electric capacitance between the control gate electrode 6 and the floating gate electrode 3 is not negligible, and operation errors in memory cells occur. When depletion occurs in the buried portion, the electric shielding effect between the floating gate electrodes 3 on both sides of the buried portion decreases. For this reason, the probability of occurrence of memory operation errors caused by the intercell interference also becomes high.

Jpn. Pat. Appln. KOKAI Publication No. 8-88285 discloses an EEPROM. In this EEPROM, element formation regions each having a convex shape and a round upper end are formed on a substrate surface while being isolated from each other by isolation trenches. A tunnel film, floating gate electrode, capacitance insulating film, and control gate electrode are formed on the element formation region.

Jpn. Pat. Appln. KOKAI Publication No. 11-177066 discloses an EEPROM manufacturing method. In this method, isolation trenches are formed by self-aligning with floating sate electrodes. After the entire surface is oxidized, the isolation trenches are filled with an insulating film. The surface of the insulating film is removed to expose the side surface of the floating gate electrodes. A second interelectrode insulating film is formed on the entire surface, and control gate electrodes are formed.

BRIEF SUMMARY OF THE INVENTION

According to an aspect of the invention, there is provided a semiconductor device including a plurality of memory cells, comprising: a plurality of floating gate electrodes which are formed on a tunnel insulating film formed on a semiconductor substrate and have an upper portion which is narrower in a channel width direction than a lower portion; an interelectrode insulating film formed on the floating gate electrodes; and a control gate electrode which is formed on the interelectrode insulating film formed on the floating gate electrodes and partially buried between the floating gate electrodes opposing each other.

According to another aspect of the invention, there is provided a method of manufacturing a semiconductor device, comprising: forming a plurality of floating gate electrodes, which have an upper portion which is narrower in a channel width direction than a lower portion, on a tunnel insulating film formed on a semiconductor substrate; filling a gap between side surfaces of the floating gate electrodes opposing each other with an element isolation insulating film; removing part of the element isolation insulating film to partially expose the side surfaces of the floating gate electrodes; forming an interelectrode insulating film on the floating gate electrodes and forming part of the interelectrode insulating film on the exposed side surfaces of the floating gate electrodes; and forming a control gate electrode on the floating gate electrodes, the control gate electrode being partially buried between the floating gate electrodes opposing each other.

BRIEF DESCRIPTION OF THE SEVERAL VIEWS OF THE DRAWING

FIG. 2 is a view showing the structure of nonvolatile memory cells according to the first embodiment;

FIG. 3 is a sectional view showing a modification of the nonvolatile memory cells according to the first embodiment;

FIG. 4 is a sectional view showing another modification of the nonvolatile memory cells according to the first embodiment;

DETAILED DESCRIPTION OF THE INVENTION

Figure 1A:
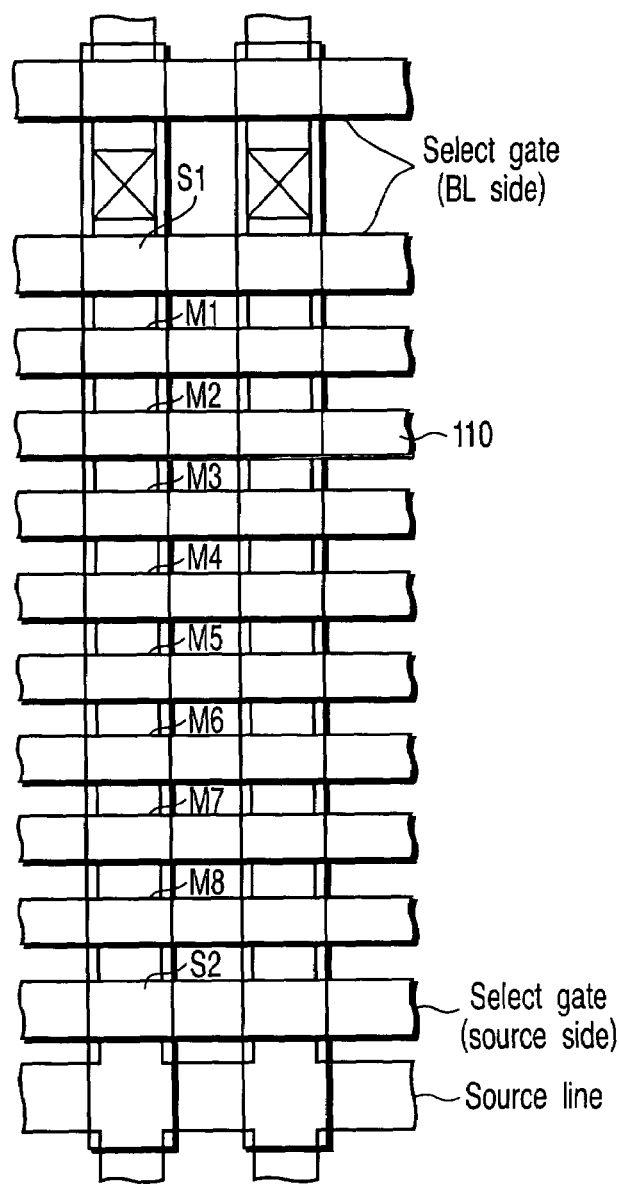
FIGS. 1A and 1B are views showing the structure of a nonvolatile memory according to the first embodiment.
Figure 1B:
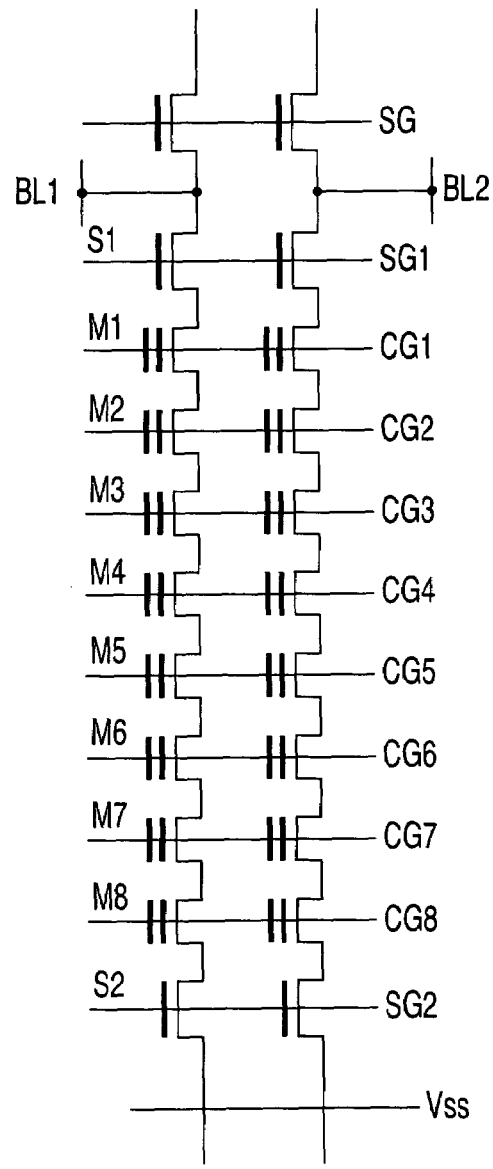

FIGS. 1A and 1B are views showing the structure of a nonvolatile memory (NAND flash memory) as a semiconductor device according to the first embodiment of the present invention. FIG. 1A is a plan view of memory cells of the NAND flash memory. FIG. 1B is an equivalent circuit diagram of the memory cells.

Referring to FIGS. 1A and 1B, reference symbols M1 to M8 denote nonvolatile memory cell portions; S1 and S2, select transistor portions; CG1 to CG8, control gates (word lines); SG1 and SG2, select gates; BL1 and BL2, bit lines; and Vss, a source voltage.

FIG. 2 is a view showing the structure of nonvolatile memory cells according to the first embodiment of the present invention. FIG. 2 is a sectional view in the word line direction (channel width direction).

A tunnel insulating film 2 is formed on a silicon substrate 1. A plurality of floating gate electrodes 3 are arranged on the tunnel insulating films 2 while being separated from each other by a predetermined distance. The width of the upper portion of each floating gate electrode 3 is smaller than that of the lower portion. An element isolation insulating film 4 is buried between the adjacent floating gate electrodes 3 up to a position in the height direction in the region where the floating gate electrodes 3 are wider at their lower portions. An interelectrode insulating film 5 is formed on the floating gate electrodes 3 and element isolation insulating film 4. A control gate electrode 6 is formed on the interelectrode insulating film 5. The control gate electrode 6 is partially buried between the adjacent floating gate electrodes 3.

Figure 9A:
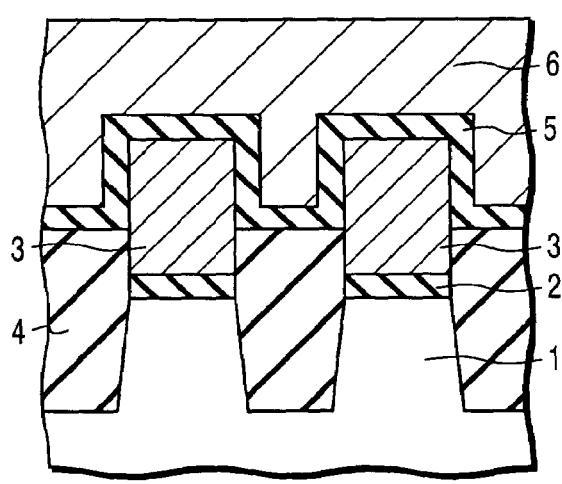
FIGS. 9A and 9B are views showing the structure of conventional nonvolatile memory cells.
Figure 9B:
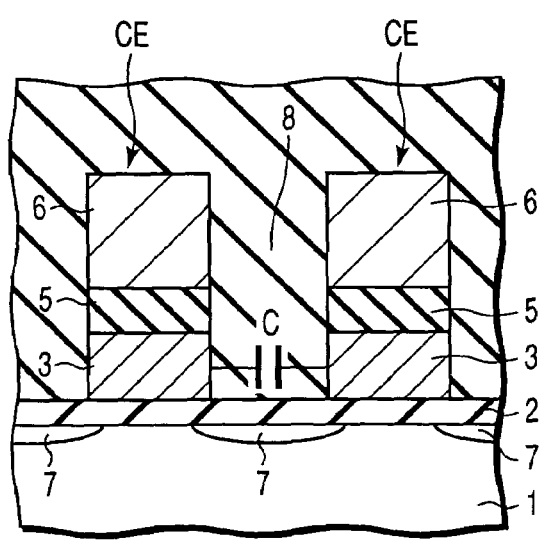

In this memory cell structure, the area of the side surface of the floating gate electrode 3 perpendicular to the bit line direction (channel length direction) can be reduced while ensuring the opposing area (the area of the interelectrode insulating film 5) between the floating gate electrode 3 and the control gate electrode 6, unlike the conventional structure shown in FIG. 9A. For this reason, the parasitic capacitance between the floating gate electrodes 3 adjacent in the bit line direction (channel length direction) can be reduced while suppressing the increase in cell operating voltage by ensuring the coupling ratio of the memory cells. Accordingly, the frequency of occurrence of memory cell operation errors can be reduced.

In this memory cell structure, a width W1 of the upper portion of the buried portion of the control gate electrode 6 is larger than a width obtained by subtracting a value twice a thickness W3 of the interelectrode insulating film 5 from a minimum interval W2 between the opposing floating gate electrodes 3. When the buried portion of the control gate electrode 6 is made of a semiconductor containing a dopant impurity, the dopant can sufficiently be diffused to the bottom of the control gate electrode 6 and consequently the dopant impurity concentration becomes sufficiently high in the buried portion. As a result, depletion hardly occurs in the buried portion when a high electric field is applied in a write/erase operation. For this reason, any operation error in memory cells which is caused by the decrease in electric capacitance between the control gate electrode 6 and the floating gate electrode 3 can be avoided. In addition, any memory operation error caused by the decrease in electric shielding effect between the adjacent floating gate electrodes 3 can also be avoided.

FIG. 3 is a sectional view showing a modification of the nonvolatile memory cells according to the first embodiment. In this modification, the element isolation insulating film 4 is buried between the adjacent floating gate electrodes 3 up to a position in the height direction in the region where the floating gate electrodes 3 become narrow. In this memory cell structure, the bottom width of the control gate electrode 6 becomes sufficiently wide, and consequently depletion more hardly occurs in the above-described buried portion of the control gate electrode 6. For this reason, the ratio of memory operation errors caused by depletion can further be reduced.

The position in the height direction in which the width of the floating gate electrode 3 decreases can be set at any portion in FIGS. 2 and 3. The position is preferably set as closer as possible to the tunnel insulating film 2 because a large effect can be obtained. The width of the floating gate electrode 3 need not always change at one step as shown in FIGS. 2 and 3. It may change at two steps, as shown in FIG. 4, or at three or more steps.

Figure 5A:
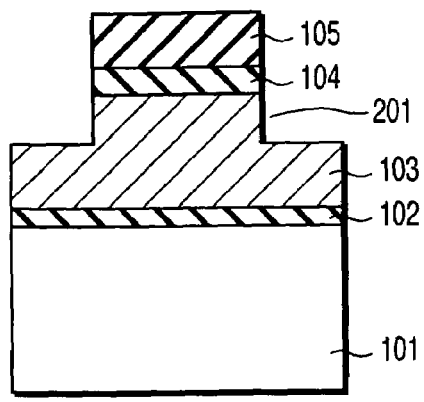
FIGS. 5A to 5D are views showing the procedures of manufacturing the nonvolatile memory cell according to the first embodiment.
Figure 5B:
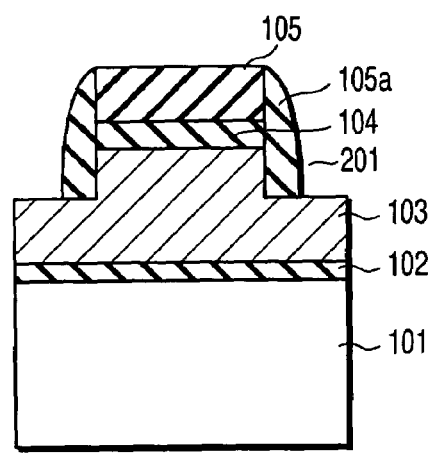
Figure 5C:
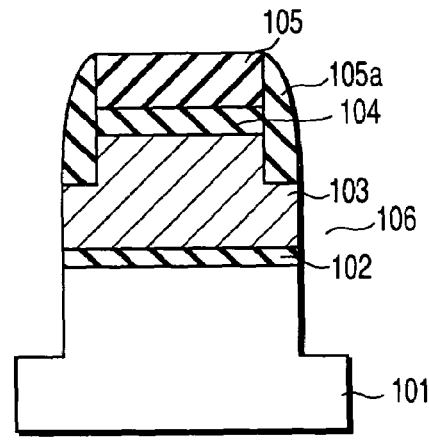
Figure 5D:
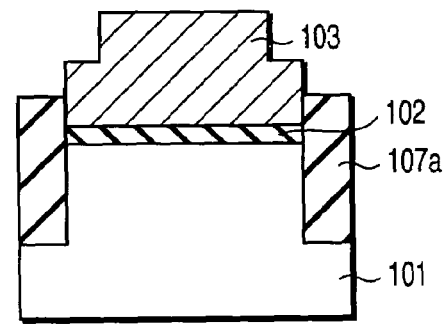
Figure 6A:
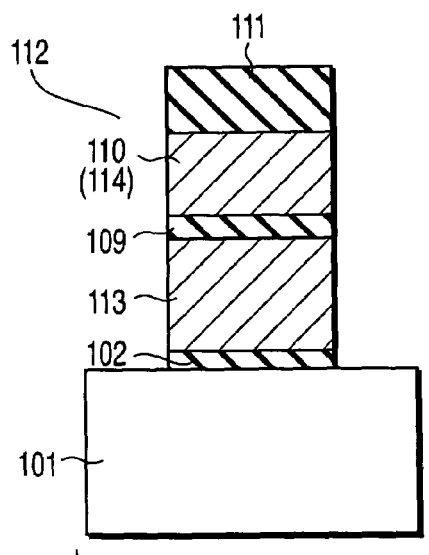
FIGS. 6A and 6B are views showing the procedures of manufacturing the nonvolatile memory cell according to the first embodiment.
Figure 6A:
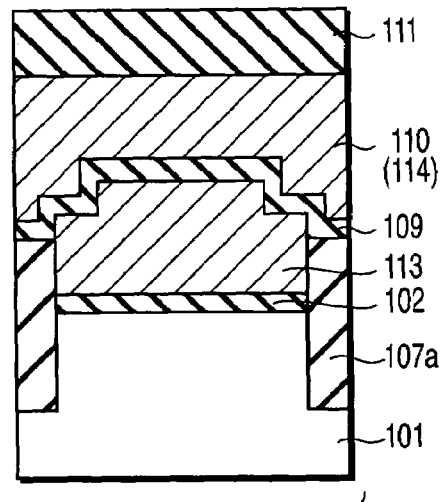
Figure 6B:
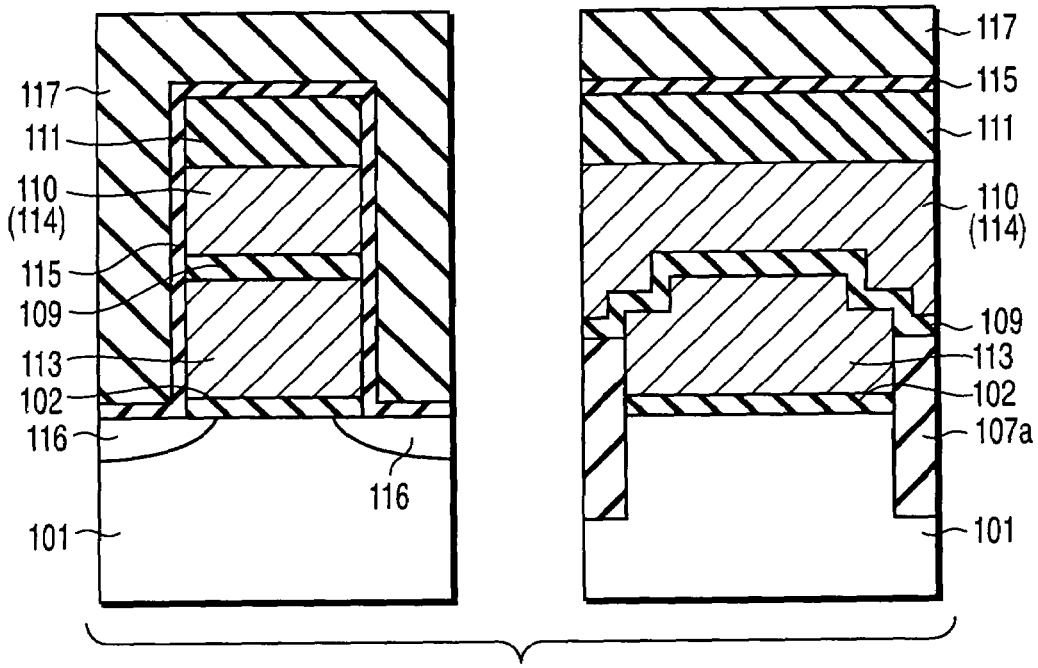

FIGS. 5A to 5D and 6A and 6B are views showing the procedures of manufacturing the nonvolatile memory cell according to the first embodiment. The procedures of manufacturing the memory cell shown in FIG. 2 will be described with reference to FIGS. 5A to 5D and 6A and 6B. FIGS. 5A to 5D are sectional views of the nonvolatile memory cell in the word line direction (channel width direction). FIGS. 6A and 6B show sectional views of the nonvolatile memory cell in the bit line direction (channel length direction) on the left side and sectional views of the nonvolatile memory cell in the word line direction (channel width direction) on the right side.

First, as shown in FIG. 5A, a desired impurity is doped in a silicon substrate 101. A 10-nm thick tunnel insulating film 102 is formed on the surface of the silicon substrate 101 by thermal oxidation. After that, a phosphorus-doped polysilicon layer 103 having a thickness of 150 nm is deposited by low-pressure CVD (Chemical Vapor Deposition) as a prospective floating gate electrode. A stopper film 104 for CMP (Chemical Mechanical Polish) and a mask film 105 for RIE (Reactive Ion Etching) are sequentially deposited by low-pressure CVD.

The mask film 105, stopper film 104, and the upper portion of the phosphorus-doped polysilicon layer 103 are sequentially etched by RIE using a resist mask (not shown). Accordingly, a sidewall portion 201 is formed.

As shown in FIG. 5B, a silicon oxide film is deposited on the entire surface by low-pressure CVD. Then, non-masking RIE is executed. At this time, the conditions of non-masking RIE are set such that a sidewall mask film 105a remains on the sidewall portion 201. As shown in FIG. 5C, the exposed region of the polysilicon layer 103 and the tunnel insulating film 102 are sequentially etched by using the mask film 105 and sidewall mask film 105a as a mask. In addition, the exposed region of the silicon substrate 101 is etched to form a 150-nm deep element isolation trench 106. Accordingly, the shape of a floating gate electrode having a wide lower portion and a narrow upper portion is formed.

As shown in FIG. 5D, a 400-nm thick silicon oxide film 107a for element isolation is deposited on the entire surface by plasma CVD to completely fill the element isolation trench 106. After that, the silicon oxide film 107a and mask film 105 at the surface portion are removed by CMP to planarize the surface. The exposed stopper film 104 is removed by chemical etching. The exposed surface of the silicon oxide film 107a is removed by etching using a diluted hydrofluoric acid solution so that the silicon oxide film 107a is etched back to a position in the height direction where the floating gate electrode is wide.

As shown in FIG. 6A, a 15-nm thick interelectrode insulating film 109 having a three-layered structure including a silicon oxide film/silicon nitride film/silicon oxide film is sequentially deposited on the entire surface by low-pressure CVD. A 100-nm thick conductive layer 110 having a two-layered structure including a polysilicon layer/tungsten silicide layer is sequentially deposited by low-pressure CVD as a prospective control gate electrode. A mask film 111 for RIE is deposited by low-pressure CVD. The mask film 111, conductive layer 110, interelectrode insulating film 109, polysilicon layer 103, and tunnel insulating film 102 are sequentially etched by RIE using a resist mask (not shown) to form slit portions 112 between stacking cells. With this process, the shapes of a floating gate electrode 113 and control gate electrode 114 are determined.

As shown in FIG. 6B, a 10-nm thick silicon oxide film 115 called an electrode sidewall oxide film is formed on the exposed surface by combining thermal oxidation and low-pressure CVD. Cell diffusion layers 116 are formed by ion implantation. A BPSG (Boro Phosphor Silicate Glass) film 117 as a prospective interlayer insulating film is formed on the entire surface by low-pressure CVD. After that, an interconnection layer and the like are formed by a known method, thereby completing a nonvolatile memory cell.

Figure 7A:
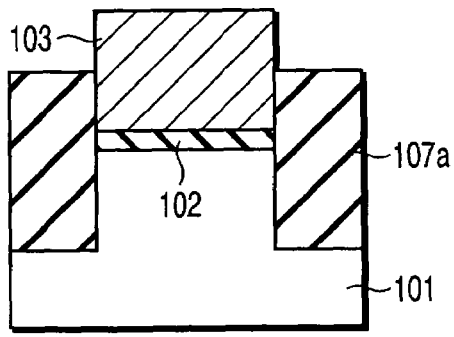
FIGS. 7A to 7C are views showing the procedures of manufacturing nonvolatile memory cell according to the second embodiment.
Figure 7B:
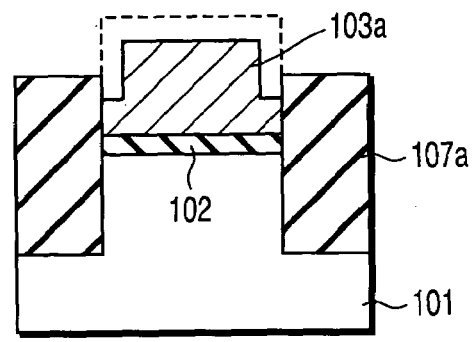
Figure 7C:
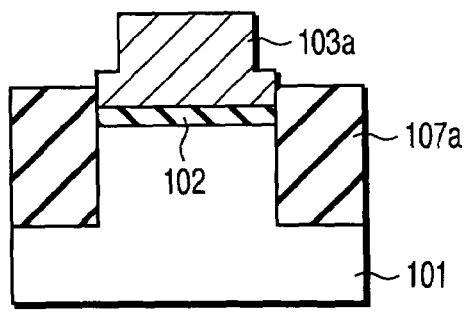

FIGS. 7A to 7C are views showing the procedures of manufacturing a nonvolatile memory cell as a semiconductor device according to the second embodiment. The procedures of manufacturing the memory cell shown in FIG. 2 will be described with reference to FIGS. 7A to 7C. FIGS. 7A to 7C are sectional views in the word line direction (channel width direction).

First, as shown in FIG. 7A, a desired impurity is doped in a silicon substrate 101. A 10-nm thick tunnel insulating film 102 is formed on the surface of the silicon substrate 101 by thermal oxidation. After that, a phosphorus-doped polysilicon layer 103 having a thickness of 150 nm is deposited by low-pressure CVD as a prospective floating gate electrode. The phosphorus-doped polysilicon layer 103 and tunnel insulating film 102 are sequentially etched by RIE using a resist mask (not shown). In addition, the exposed region of the silicon substrate 101 is etched to form a 150-nm deep element isolation trench.

A 400-nm thick silicon oxide film 107a for element isolation is deposited on the entire surface by plasma CVD to completely fill the element isolation trench. After that, the surface is planarized by CMP. The exposed surface of the silicon oxide film 107a is removed by etching using a diluted hydrofluoric acid solution to expose the side surface of the floating gate electrode 103 by 70 nm.

As shown in FIG. 7B, the exposed surface of a floating gate electrode 103a is removed by 30 nm by isotropic etching using an alkali solution. Accordingly, the floating gate electrode 103a obtains a wide lower portion and a narrow upper portion. As shown in FIG. 7C, the exposed surface of the silicon oxide film 107a is removed by etching using a diluted hydrofluoric acid solution so that the silicon oxide film 107a is etched back to a position in the height direction where the floating gate electrode is wide.

Then, the memory cell structure as shown in FIG. 2 is completed by using the method shown in FIGS. 6A and 6B.

Figure 8A:
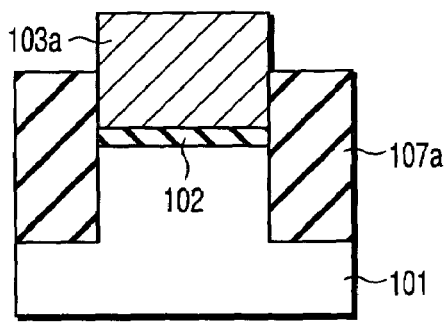
FIGS. 8A to 8D are views showing the procedures of manufacturing nonvolatile memory cell according to the third embodiment.
Figure 8B:
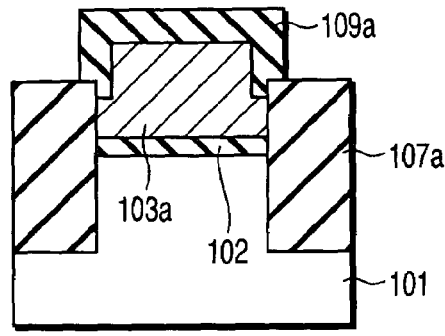

FIGS. 8A and 8B are views showing the procedures of manufacturing a nonvolatile memory cell as a semiconductor device according to the third embodiment. The procedures of manufacturing the memory cell shown in FIG. 3 will be described with reference to FIGS. 8A and 8B. FIGS. 8A and 8B are sectional views in the word line direction (channel width direction).

First, as shown in FIG. 8A, a desired impurity is doped in a silicon substrate 101. A 7-nm thick tunnel insulating film 102 is formed on the surface of the silicon substrate 101 by thermal oxidation. After that, a phosphorus-doped polysilicon layer 103 having a thickness of 150 nm is deposited by low-pressure CVD as a prospective floating gate electrode. The phosphorus-doped polysilicon layer 103 and tunnel insulating film 102 are sequentially etched by RIE using a resist mask (not shown). In addition, the exposed region of the silicon substrate 101 is etched to form a 150-nm deep element isolation trench.

A 400-nm thick silicon oxide film 107a for element isolation is deposited on the entire surface by plasma CVD to completely fill the element isolation trench. After that, the surface is planarized by CMP. The exposed surface of the silicon oxide film 107a is removed by etching using a diluted hydrofluoric acid solution to expose the side surface of the floating gate electrode 103 by 70 nm.

As shown in FIG. 8B, oxidation is executed in an oxygen atmosphere (oxidation atmosphere) containing 10% oxygen radicals at 800° C. for 1 hr to form an 8-nm thick interelectrode insulating film 109a made of a radical oxide film. Accordingly, a floating gate electrode 103a obtains a wide lower portion and a narrow upper portion. The opening width between the interelectrode insulating films 109a formed on the side surfaces of the adjacent floating gate electrodes 103 is larger than a width obtained by subtracting a value twice the thickness of the interelectrode insulating film 109a from the minimum interval between the floating gate electrodes 103.

Then, the memory cell structure as shown in FIG. 3 is completed by using the method shown in FIGS. 6A and 6B.

Figure 8C:
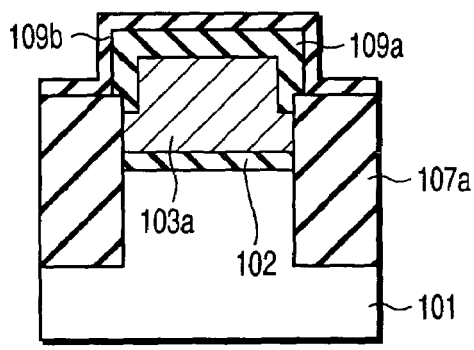

As shown in FIG. 8C, after the radial oxide film 109a is formed, a CVD oxide film 109b may be deposited to form an interelectrode insulating film having a two-layered structure. As long as the lowermost layer is a radical oxide film, an insulating film of any type can be formed on it. A multilayered structure may be formed.

When the interelectrode insulating film 109a or part of it is formed by radical oxidation, as in this embodiment, the interelectrode insulating film 109a can be formed at a relatively low temperature. Hence, thermal damage of the tunnel oxide film decreases, and the degradation in characteristics of the tunnel oxide film can be suppressed. In addition, the surface properties of the exposed element isolation oxide film can be modified by radical oxidation. For this reason, the leakage current between the adjacent floating gate electrodes 103a can be reduced, and the reliability of the memory cells can be increased.

Figure 8D:
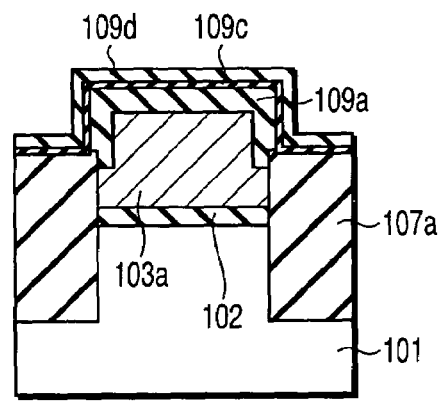

Assume that an interelectrode insulating film having a three-layered structure including the silicon oxide film 109a, silicon nitride film 109c, and silicon oxide film 109d is formed, as shown in FIG. 8D. When the silicon nitride layer 109c is formed by thermal nitriding in a gas atmosphere containing nitrogen such as ammonia or nitrogen monoxide, the thickness of the nitride film can be decreased to about 1 nm. For this reason, the buried portion of the control gate electrode can be wider. The same effect as described above can be obtained even when the silicon nitride film 109c is formed by radical nitriding.

Assume that the silicon nitride film 109c shown in FIG. 8D is formed by CVD using hexachloro-disilane and ammonia as source gases. In this case, since the electron trap density of the silicon nitride film 109c is high, the nitride film thickness can be reduced to about 1 nm, while suppressing the degradation of data retention characteristics. For this reason, the buried portion of the control gate electrode can be wider. Any other source gas combination can be applied if the electron trap density of a film can be increased by the film formation method.

The silicon nitride film 109c shown in FIG. 8D may be changed to an alumina film. The work function difference between an alumina film and a silicon oxide film is larger than that between an alumina film and a silicon nitride film. For this reason, the thickness of, e.g., an alumina film can be reduced to about 1 nm, while suppressing the degradation of data retention characteristics, and the buried portion of the control gate electrode can be wider. Any other insulating film material can be used as long as the work function is larger than that of a silicon nitride film.

According to the embodiments of the present invention, the parasitic capacitance between floating gate electrodes adjacent in the bit line direction can be reduced while suppressing an increase in operating voltage by ensuring the coupling ratio of the memory cells. Accordingly, memory cell operation errors can be avoided. In addition, memory cell operation errors caused by depletion in the buried portion of the control gate electrode can be avoided.

Memory cell operation errors caused by depletion in the control gate electrode can be avoided while suppressing degradation in characteristics of the tunnel insulating film. Since the surface properties of the element isolation insulating film can be modified, leakage failures between opposing floating gate electrodes can be avoided. Since the interelectrode insulating film can be made thin, memory cell operation errors caused by depletion in the control gate electrode can be avoided.

According to the embodiments of the present invention, a semiconductor device which avoids a memory cell operation error caused by interference between adjacent memory cells and a method of manufacturing the same can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device including a plurality of memory cells, comprising:
a plurality of floating gate electrodes which are formed on a tunnel insulating film formed on a top surface of a semiconductor substrate and having an upper portion which is narrower in a channel width direction than a lower portion, the lower portion including a largest-width portion which is largest in width with respect to the channel width direction;
an element isolation insulating film which is formed between adjacent ones of the floating gate electrodes aligned in the channel width direction, the element isolation insulating film having a bottom surface below the top surface of the semiconductor substrate;
an interelectrode insulating film formed on the floating gate electrodes and the element isolation insulating film; and
a control gate electrode which is formed on the interelectrode insulating film formed on the floating gate electrodes and the element isolation insulating film and partially buried between the floating gate electrodes opposing each other, wherein
at least a part of a sidewall of said largest-width portion of each of the floating gate electrodes is in direct contact with a left or right sidewall of the element isolation insulating film, and
a width, in the channel width direction, of the upper portion of the floating gate electrode is smaller than a width, in the channel width direction, of a portion of the floating gate electrode where the floating gate electrode is in contact with the tunnel insulating film.

2. A device according to claim 1, wherein part of the interelectrode insulating film is in contact with the floating gate electrode at a first surface parallel to the semiconductor substrate surface, said first surface being located between an upper surface and a lower surface of the floating gate electrode.

3. A device according to claim 1, wherein at least the buried portion of the control gate electrode is made of a semiconductor containing a dopant impurity.

4. A device according to claim 1, wherein a width of an upper portion of the buried portion of the control gate electrode is larger than a width obtained by subtracting a value twice a thickness of the interelectrode insulating film from a minimum interval between the floating gate electrodes opposing each other.

5. A device according to claim 1, wherein the width of the floating gate electrode in the channel width direction changes in a plurality of steps in a height direction perpendicular to a surface of the semiconductor substrate.

6. A device according to claim 1, wherein the interelectrode insulating film comprises an oxide film.

7. A device according to claim 1, wherein the interelectrode insulating film comprises a nitride film.

8. A device according to claim 1, wherein the interelectrode insulating film comprises a first silicon oxide film, a silicon nitride film, and a second silicon oxide film.

9. A device according to claim 1, wherein the interelectrode insulating film comprises a first silicon oxide film, an insulating film whose work function is larger than that of a silicon nitride film, and a second silicon oxide film.

10. A device according to claim 9, wherein the insulating film comprises an alumina film.

11. A device according to claim 1, wherein the whole sidewall of the largest-width portion of each of the floating gate electrodes is in contact with the sidewall of the element isolation insulating film.

12. A device according to claim 1, wherein a position of an upper surface of the largest-width portion of each of the floating gate electrodes is higher or lower than that of an upper surface of the element isolation insulating film.

13. A device according to claim 1, wherein a height of an upper surface of the largest-width portion of each of the floating gate electrodes is equal to that of an upper surface of the element isolation insulating film.

14. A device according to claim 1, wherein:
- the lower portion of the plurality of floating gate electrodes are formed at a first interval along the channel width direction, and
- the upper portion of the plurality of floating gate electrodes are formed at a second interval along the channel width direction, the second interval being greater than the first interval.

* * * * *

UNITED STATES PATENT AND TRADEMARK OFFICE
CERTIFICATE OF CORRECTION

PATENT NO. : 7,705,391 B2  Page 1 of 1
APPLICATION NO. : 11/226287
DATED : April 27, 2010
INVENTOR(S) : Ozawa It is certified that error appears in the above-identified patent and that said Letters Patent is hereby corrected as shown below:

Claim 14, column 10, line 5, change "are formed" to --is formed--.

Claim 14, column 10, line 8, change "are formed" to --is formed--.

Signed and Sealed this

Sixth Day of July, 2010

David J. Kappos
*Director of the United States Patent and Trademark Office*